United States Patent
Goss

(10) Patent No.: US 9,634,631 B2
(45) Date of Patent: Apr. 25, 2017

(54) CONTROL SYSTEM FOR A POWER AMPLIFIER

(75) Inventor: Martin Goss, Portsmouth (GB)

(73) Assignee: Astrium Limited, Stevenage (GB)

( * ) Notice: Subject to any disclaimer, the term of this patent is extended or adjusted under 35 U.S.C. 154(b) by 206 days.

(21) Appl. No.: 14/350,976

(22) PCT Filed: Sep. 12, 2012

(86) PCT No.: PCT/EP2012/067779
§ 371 (c)(1),
(2), (4) Date: Nov. 7, 2014

(87) PCT Pub. No.: WO2013/053557
PCT Pub. Date: Apr. 18, 2013

(65) Prior Publication Data
US 2015/0054582 A1    Feb. 26, 2015

(30) Foreign Application Priority Data
Oct. 10, 2011   (EP) .................................... 11275122

(51) Int. Cl.
*H03F 1/26* (2006.01)
*H03G 1/00* (2006.01)
(Continued)

(52) U.S. Cl.
CPC ......... *H03G 1/0017* (2013.01); *H03F 1/3247* (2013.01); *H03F 1/3282* (2013.01);
(Continued)

(58) Field of Classification Search
CPC ........ H04W 52/52; H03F 1/301; H03F 1/342; H03F 2200/129; H03F 2200/333;
(Continued)

(56) References Cited

U.S. PATENT DOCUMENTS 5,101,172 A * 3/1992 Ikeda .................... H03F 1/0238
330/136
5,455,537 A   10/1995 Larkin et al.
(Continued)

FOREIGN PATENT DOCUMENTS

EP    1063825 A2   12/2000
EP    1777813 A1    4/2007
(Continued)

OTHER PUBLICATIONS

International Preliminary Report on Patentability on PCT/EP2012/067779 dated Apr. 24, 2014.
(Continued)

*Primary Examiner* — Khanh V Nguyen
(74) *Attorney, Agent, or Firm* — McCarter & English, LLP; David R. Burns

(57) ABSTRACT

An apparatus for controlling the gain and phase of an input signal input to a power amplifier comprises a gain control loop configured to control the gain of the input signal based on power levels of the input signal and an amplified signal output by the power amplifier, to obtain a predetermined gain of the amplified signal, and a phase control loop configured to obtain an error signal related to a phase difference between a first signal derived from the input and a second signal derived from the amplified signal, and control the phase based on the error signal, to obtain a predetermined phase of the amplified signal. The phase control loop delays the first signal, such that the delayed first signal and the second signal used to obtain the error signal correspond to the same part of the input signal. The apparatus may be included in a satellite.

15 Claims, 5 Drawing Sheets

(51) Int. Cl.
*H03F 1/34* (2006.01)
*H03F 3/19* (2006.01)
*H03F 3/21* (2006.01)
*H03F 1/32* (2006.01)

(52) U.S. Cl.
CPC ............... *H03F 1/345* (2013.01); *H03F 3/19* (2013.01); *H03F 3/21* (2013.01); *H03F 1/3241* (2013.01); *H03F 2200/405* (2013.01); *H03F 2200/438* (2013.01); *H03F 2200/451* (2013.01); *H03F 2200/66* (2013.01); *H03F 2201/3233* (2013.01)

(58) Field of Classification Search
CPC ..... H03F 2200/451; H03F 2203/45116; H03F 3/193; H03F 3/45179; H03F 2200/102; H03F 1/0222; H03F 1/26; H03F 1/3223; H03G 3/301; H03G 3/30; H03G 3/3005; H03G 3/20
USPC .................................. 330/136, 149, 278–280
See application file for complete search history.

(56) References Cited

U.S. PATENT DOCUMENTS

| | | | |
|---|---|---|---|
| 5,528,196 A | | 6/1996 | Baskin et al. |
| 5,675,288 A | * | 10/1997 | Peyrotte ................ H03F 1/3247 330/136 |
| 5,742,201 A | | 4/1998 | Eisenberg et al. |
| 6,002,300 A | * | 12/1999 | Herbster ............... H03F 1/3241 330/136 |
| 6,043,707 A | * | 3/2000 | Budnik ................... H03C 5/00 330/10 |
| 6,091,298 A | * | 7/2000 | McNicol ............... H03F 1/3241 330/107 |
| 6,385,436 B1 | | 5/2002 | Horiguchi et al. |
| 6,600,370 B2 | * | 7/2003 | Park ........................ H03F 3/602 330/136 |
| 6,714,073 B2 | * | 3/2004 | Suto ...................... H03F 1/3247 330/136 |
| 6,972,622 B2 | | 12/2005 | Jackson et al. |
| 7,088,968 B2 | | 8/2006 | Zipper |
| 7,113,035 B2 | * | 9/2006 | Koukkari .............. H03F 1/3247 330/136 |
| 7,663,436 B2 | | 2/2010 | Takano et al. |
| 2005/0168282 A1 | | 8/2005 | Koukkari et al. |

FOREIGN PATENT DOCUMENTS

| | | |
|---|---|---|
| JP | S6278902 A | 4/1987 |
| JP | 2003051722 A | 2/2003 |

OTHER PUBLICATIONS

International Search Report and Written Opinion for International Application No. PCT/EP2012/06779 mailed Oct. 26, 2012.
English Translation of Notice of Reasons for Rejection by Japanese Patent Office for Japanese Patent Application No. 2014-534982 dated May 31, 2016.
English Translation of Official Action by Federal Service on Industrial Property of Russia for Russian Patent Applicatio No. 2014118567 dated Jun. 20, 2016.
English Translation of Decision on Grant for Russian Application No. 2014118567 by Russian Federal Service for Intellectual Property, Patents and Trademarks dated Dec. 23, 2016.

\* cited by examiner

US 9,634,631 B2

CONTROL SYSTEM FOR A POWER AMPLIFIER

RELATED APPLICATIONS

This application is a 35 U.S.C. §371 national stage application of International Application No. PCT/EP2012/067779, filed Sep. 12, 2012, which claims the benefit of European Patent Application No. 11275122.7, filed Oct. 10, 2011. The entire contents of each of the foregoing applications are explicitly incorporated herein by reference.

FIELD OF THE INVENTION

The present invention relates to a control system for a power amplifier. In particular, the present invention relates to a control system which controls a power amplifier based on an error signal related to a phase difference between a delayed first signal derived from an input signal and a second signal derived from an amplified signal.

BACKGROUND OF THE INVENTION

Power amplifiers are used in communications satellites to amplify RF signals. Such power amplifiers are known to exhibit nonlinearity, whereby the gain and phase of the amplified output RF signal varies nonlinearly with the input signal power. To compensate for this, gain and phase distortions can be applied to the input signal before it reaches the amplifier stage, so as to maintain a constant gain and phase of the output signal.

FIG. 1 illustrates an open-loop control system used in a conventional communications satellite to control the gain and phase of the input signal. The system comprises a power amplifier 101, a variable attenuator 102, a phase shifter 103, an input coupler 104, a detector 105, a processor 106 and a memory 107. An initial calibration procedure is carried out in which the response of the amplifier 101 is characterised over a range of different signal powers. A lookup table (LUT) is created to record suitable gain and phase predistortions to be applied to the input signal for any given power level. The LUT is stored in the memory 107.

During operation, the detector 104 measures the power level of a coupled input signal received from the input coupler 103. The processor 106 then determines the power of the input signal $RF_{IN}$ based on a known coupling factor of the input coupler 103. The processor 106 searches the LUT to determine how the gain and phase of the input signal should be adjusted, and controls the variable attenuator 102 and phase shifter 103 to apply the appropriate gain and phase predistortions. However, a drawback of this approach is the lengthy calibration procedure, which can take up to 48 hrs.

SUMMARY OF THE INVENTION

According to the present invention, there is provided an apparatus for controlling a gain and phase of an input signal input to a power amplifier, the apparatus comprising gain control means for controlling the gain of the input signal, phase control means for controlling the phase of the input signal, a gain control loop configured to control the gain control means based on a power level of the input signal and a power level of an amplified signal output by the power amplifier, to obtain a predetermined gain of the amplified signal, and a phase control loop configured to obtain an error signal related to a phase difference between a first signal derived from the input signal and a second signal derived from the amplified signal, and control the phase control means based on the error signal to obtain a predetermined phase of the amplified signal, wherein the phase control loop is arranged to delay the first signal before obtaining the error signal, such that the delayed first signal and the second signal used to obtain the error signal correspond to the same part of the input signal.

The gain control loop may be configured to receive a third signal derived from the input signal and a fourth signal derived from the amplified signal, and may be configured to compare a power level of the third signal and a power level of the fourth signal and control the gain control means based on the result of the comparison.

The apparatus may further comprise an input coupler configured to receive the input signal and output the third signal, the input coupler having a first coupling factor, and an output coupler configured to receive the amplified signal and output the fourth signal, the output coupler having a second coupling factor, wherein the first and second coupling factors are selected such that when the amplified signal has the predetermined gain, the third signal and the fourth signal have substantially the same power level.

The gain control loop may comprise a first detector configured to measure a power level of the third signal, and a second detector configured to measure a power level of the fourth signal, wherein the first and second detectors may be matched root-mean-squared RMS detectors.

The gain control loop may comprise a first detector configured to measure a power level of the third signal, a second detector configured to measure a power level of the fourth signal, and means for scaling an output of the first detector or an output of the second detector, so that the outputs of the first and second detectors are substantially identical when the third and fourth signals have the same power.

The amplified signal may be clipped by the power amplifier, and the apparatus may further comprise a limiter configured to clip the input signal in correspondence with the clipping of the amplified signal by the power amplifier, such that the third signal received by the first detector and the fourth signal received by the second detector are clipped by substantially the same amount.

The phase control loop may comprise delaying means for delaying the first signal, error signal generating means for generating the error signal based on the second signal and the delayed first signal, a detector for measuring a power of the error signal and processing means configured to control the phase control means based on the measured power of the error signal, wherein the delaying means are configured such that the electrical length of a first path to the error signal generating means via the power amplifier is substantially the same as the electrical length of a second path to the error signal generating means via the delaying means.

The processing means may be configured to control the phase control means in order to minimise the measured power of the error signal.

The current gain and phase of the amplified signal may be dependent on an operational history of the power amplifier.

The power amplifier may be a Gallium Nitride GaN solid-state power amplifier.

A satellite may comprise a power amplifier and the apparatus, the apparatus being configured to control the gain and phase of the input signal input to the power amplifier.

According to the present invention, there is also provided a method for controlling a gain and phase of an input signal input to a power amplifier, the method comprising controlling the gain of the input signal based on a power level of the input signal and a power level of an amplified signal output by the power amplifier, to obtain a predetermined gain of the amplified signal, delaying a first signal obtained from the input signal, obtaining an error signal related to a phase difference between the delayed first signal and a second signal derived from the amplified signal, and controlling the phase of the input signal according to the error signal to obtain a predetermined phase of the amplified signal, wherein the first signal is delayed such that the delayed first signal and the second signal used to obtain the error signal correspond to the same part of the input signal.

The method may further comprise comparing a power level of a third signal derived from the input signal and a power level of a fourth signal derived from the amplified signal, wherein the gain of the input signal is controlled based on the result of the comparison.

The third and fourth signals may be arranged to have the same power level when the amplified signal has the predetermined gain.

According to the present invention, there is further provided a satellite comprising a power amplifier for receiving an input signal and outputting an amplified signal, gain control means for controlling a gain of the input signal, phase control means for controlling a phase of the input signal, and a control loop configured to obtain an error signal related to a phase difference between a first signal derived from the input signal and a second signal derived from the amplified signal, and control the gain control means and phase control means based on the error signal to obtain a predetermined gain and phase of the amplified signal, wherein the control loop is arranged to delay the first signal before obtaining the error signal, such that the delayed first signal and the second signal used to obtain the error signal correspond to the same part of the input signal.

The satellite may further comprise a first coupler for outputting the first signal, a second coupler for outputting the second signal, delaying means (721) for delaying the first signal, error signal generating means for receiving the delayed first signal and the second signal, and generating the error signal related to the phase difference between the delayed first signal and the second signal, a detector for measuring a power of the error signal, and processing means configured to control the gain control means and the phase control means based on the measured power of the error signal, wherein the delaying means may be configured such that the electrical length of a first path to the error signal generating means via the power amplifier is substantially the same as the electrical length of a second path to the error signal generating means via the delaying means.

The current gain and phase of the amplified signal may be dependent on an operational history of the power amplifier.

The power amplifier may be a Gallium Nitride GaN solid-state power amplifier.

BRIEF DESCRIPTION OF THE DRAWINGS

Embodiments of the present invention will now be described, by way of example only, with reference to the accompanying drawings, in which.

DETAILED DESCRIPTION

Figure 1:
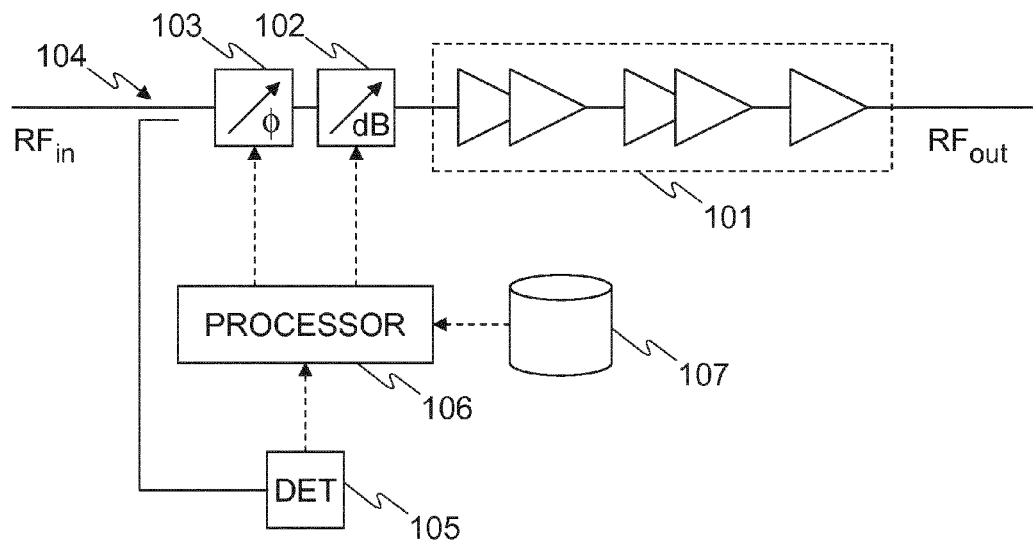
FIG. 1 illustrates a conventional control system for a power amplifier.
Figure 2:
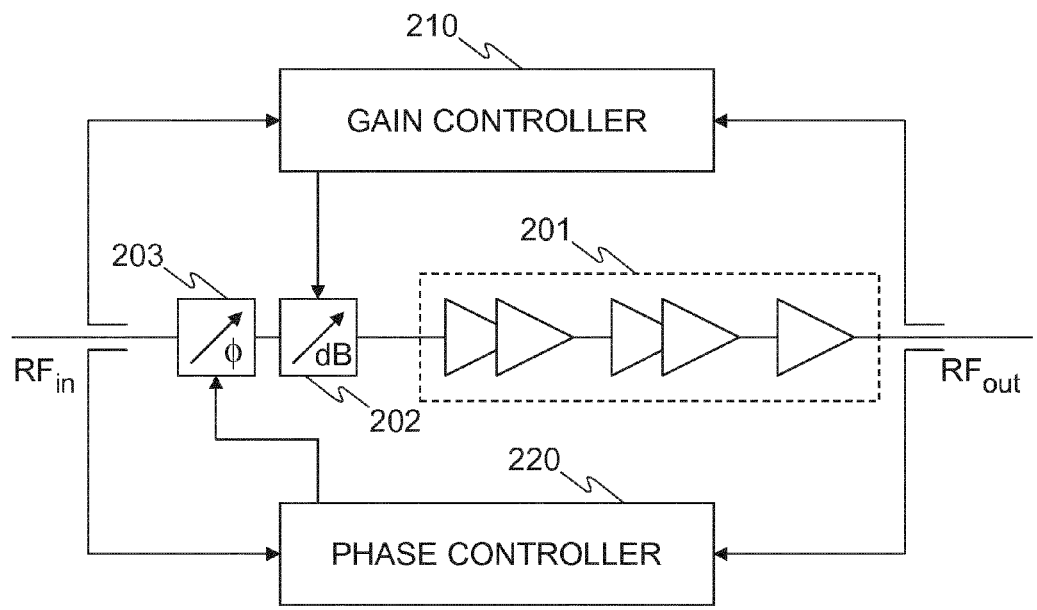
FIG. 2 illustrates a control system for a power amplifier according to an embodiment of the present invention.

Referring now to FIG. 2, a system for controlling the gain and phase of an input signal of a power amplifier is illustrated, according to an embodiment of the present invention. The system comprises a power amplifier 201, a gain control module 202, a phase control module 203, a gain control loop 210 for controlling the gain control module 202, and a phase control loop 220 for controlling the phase control module 203. The gain control module 202 may, for example, be a variable attenuator such as the one shown in FIG. 1, and the phase control module 203 may, for example, be a phase shifter such as the one shown in FIG. 1. The gain control module 202 and phase control module 203 can be controlled to change the gain and phase, respectively, of the input RF signal ($RF_{IN}$) before it is input to the power amplifier 201. Although in FIG. 2 the $RF_{IN}$ signal is input to the phase control module 203 before the gain control module 202, in other embodiments the order of the phase control and gain control modules may be reversed.

The gain control and phase control loops 210, 220 each receive a signal derived from the $RF_{IN}$ signal and a signal derived from the output RF signal ($RF_{OUT}$). Each control loop 210, 220 is therefore able to monitor both the $RF_{IN}$ and $RF_{OUT}$ signals. The gain control loop 210 and phase control loop 220 are configured to control the gain control module 202 and the phase control module 203 respectively, to apply gain and phase predistortions to the $RF_{IN}$ signal in order to maintain linearity of the power amplifier 201.

Because the control loops 210, 220 are configured to monitor the output signal $RF_{OUT}$, the gain and phase of the input signal $RF_{IN}$ can be adjusted based on a current value of the output signal, i.e. based on the current performance of the power amplifier. Therefore in the present embodiment, it is not necessary to make assumptions about the behaviour of the amplifier. As such, a calibration procedure is not required for the control system shown in FIG. 2.

Also, because the control system of FIG. 2 monitors the $RF_{OUT}$ signal produced by the power amplifier 201, the control system can accurately control power amplifiers that exhibit hysteresis-type memory effects, in which the current performance of the amplifier is dependent on its operational history. That is, the current gain and phase of the amplified signal may be dependent on the operational history of the power amplifier. The operational history can include recent operating parameters of the power amplifier, such as input signal power and a gain and/or phase applied to the input signal, as well as environmental parameters to which the amplifier has recently been exposed. For example, for any given power level of the $RF_{IN}$ signal or temperature of the amplifier, the amplifier may amplify the signal differently depending on whether the amplifier was recently used to amplify a high-power signal, or to amplify a low-power signal. One such type of power amplifier that exhibits significant memory effects is a Gallium Nitride (GaN) amplifier. Therefore embodiments of the present invention may be particularly suitable for controlling GaN amplifiers. In contrast, the conventional open-loop control system of FIG. 1 cannot be used with amplifiers that exhibit a hysteresis-type memory effect.

Furthermore, in comparison to the conventional control system of FIG. 1, the control system of FIG. 2 uses separate control loops 210, 220 to control the gain and phase of the input signal. Therefore the processing performed in each control loop can be simplified, since each loop controls only one variable, i.e. the gain or the phase. Accordingly, in FIG. 2 the control system can have a faster response time than the conventional control system of FIG. 1.

Figure 3:
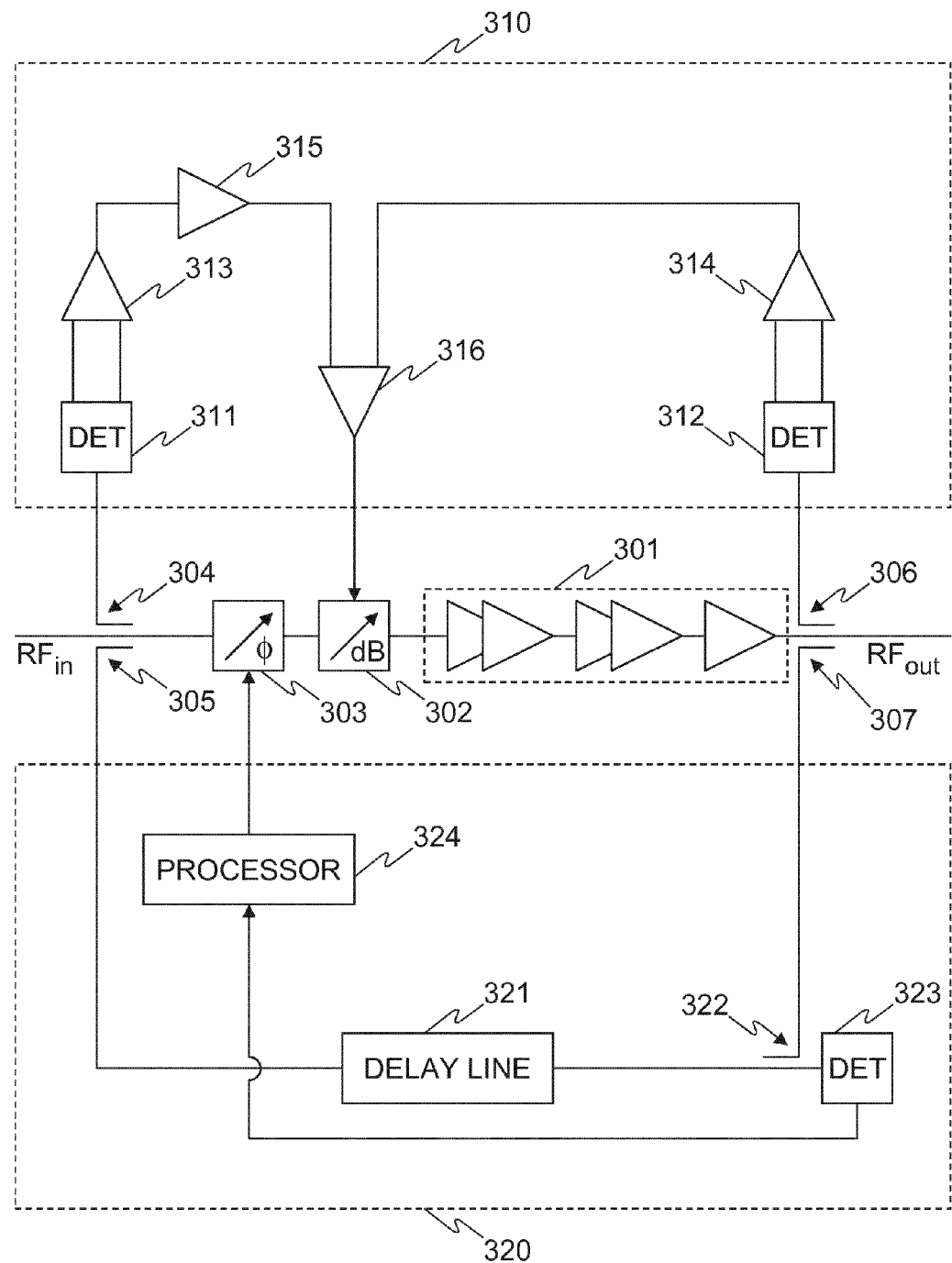
FIG. 3 illustrates details of gain and phase control loops for controlling a power amplifier, according to an embodiment of the present invention.

Referring now to FIG. 3, gain and phase control loops for controlling a power amplifier are schematically illustrated in detail, according to an embodiment of the present invention. Although one such structure is shown in FIG. 3, the invention is not limited to this arrangement. In general, the gain control loop and phase control loop may have any structure that provides the required functionality.

As shown in FIG. 3, the control system comprises a gain control module 302 and a phase control module 303, coupled to the input of a power amplifier 301. The system further comprises a first input coupler 304 and second input coupler 305. The first input coupler 304 is configured to direct a first coupled input signal, which is a coupled portion of the $RF_{IN}$ signal, to the gain control loop 310. The second input coupler 305 is configured to direct a second coupled input signal, which is a coupled portion of the $RF_{IN}$ signal, to the phase control loop 320. The system further comprises a first output coupler 306 and a second output coupler 307. The first output coupler 306 is configured to direct a first coupled output signal, which is a coupled portion of the $RF_{OUT}$ signal, to the gain control loop 310. The second output coupler 307 is configured to direct a second coupled output signal, which is a coupled portion of the $RF_{OUT}$ signal, to the phase control loop 320.

The first and second input couplers 304, 305 may be formed as a single unit or as separate units, and the first and second output couplers 306, 307 may be formed as a single unit or as separate units. The first and second input couplers 304, 305 may be configured to have the same coupling factor such that the first and second coupled input signals have the same power level. Alternatively, the first and second input couplers 304, 305 may be configured to have different coupling factors such that the first and second coupled input signals have different power levels. Similarly, the first and second output couplers 306, 307 may be configured to have the same coupling factor such that the first and second coupled output signals have the same power level, or may be configured to have different coupling factors such that the first and second coupled output signals have different power levels. The coupling factor of each of the first and second input couplers 304, 305 and first and second output couplers 306, 307 may be chosen to ensure that during normal operation of the power amplifier 301 and control system, the first and second coupled input and output signals have power levels that can be detected by the gain and phase control loops 310, 320.

Although in FIG. 3 separate couplers 304, 305 are used to generate the first coupled input signal and second coupled input signal, in other embodiments a single input coupler may be provided. In such embodiments, means for splitting the coupled input signal into the first and second coupled input signals may be provided. For example, a rat-race coupler could be used to split a coupled input signal into the first coupled input signal to be sent to the gain control loop, and the second coupled input signal to be sent to the phase control loop. Similarly, a single output coupler connected to splitting means such as a rat-race coupler could be used to generate both the first and second output signals.

In the present embodiment, the gain control loop 310 comprises an input detector 311 arranged to receive the first coupled input signal from the first input coupler 304. The input detector 311 is configured to measure the power level of the first coupled input signal, and send a signal representing the measured power to a first differential amplifier 313. For example, the input detector 311 may be a root-mean-squared (RMS) detector configured to output a voltage that is representative of the RMS power of the first coupled input signal.

The gain control loop 310 further comprises an output detector 312 arranged to receive the first coupled output signal from the first output coupler 306. The output detector 312 is configured to measure the power level of the first coupled output signal, and send a signal representing the measured power to a second differential amplifier 314. Like the input detector 311, the output detector 312 may be an RMS detector configured to output a voltage that is representative of the RMS power of the first coupled output signal.

In more detail, the input detector 311 includes two matched RMS detectors biased by the same DC bias. One of the detectors receives the RF first coupled input signal, and outputs the measured power level to one input of the first differential amplifier 313. The other detector does not receive the first coupled input signal, and outputs a reference signal to the other input of the first differential amplifier 313. The first differential amplifier 313 therefore outputs an amplified signal that is representative of the power level of the first coupled input signal. The output detector 312 and second differential amplifier 314 are arranged similarly to the input detector 311 and first differential amplifier 313. However, in other embodiments other arrangements may be used to detect power levels of the first coupled input signal and first coupled output signal.

In the present embodiment, the gain control loop 310 further comprises a scaling amplifier 315 coupled to an output of the first differential amplifier 314. The scaling amplifier is configured to amplify the signal from the first differential amplifier 314, to account for any mismatch between the input detector 311 and the output detector 312. That is, if the input detector 311 and output detector 312 are not matched, each detector may output a different voltage for any given signal power level. Alternatively, matched detectors may be used as the input and output detectors 311, 312, in which case the scaling amplifier 315 may be omitted.

Although in the present embodiment an amplifier is provided as a means for scaling the signal produced by one of the detectors, in other embodiments alternative scaling means may be used. Instead of amplifying the signal from one of the detectors, the scaling means could be arranged to pull down the output of one of the differential amplifiers 313, 314 by a suitable amount, for example using a resistive divider, to compensate for any mismatch between the detectors. Also, although in FIG. 3 the scaling means, i.e. the scaling amplifier 315, is coupled to an output of the first differential amplifier 313, the present invention is not limited to this particular arrangement. For example, the scaling means 315 could be coupled to the output of the second differential amplifier 314.

Continuing with reference to FIG. 3, the scaled output of the first differential amplifier 313 and the output of the second differential amplifier 314 are coupled to the inputs of another differential amplifier 316, hereinafter referred to as the loop amplifier 316. The loop amplifier 316 generates a gain control signal which is representative of a difference between the scaled output of the first differential amplifier 313 and the output of the second differential amplifier 314. The gain control signal is sent to the gain control module 302, which determines based on the value of the gain control signal whether to adjust the gain being applied to the $RF_{IN}$ signal. For example, the gain control module 302 may be configured to adjust the gain in order to minimise the value of the gain control signal received from the loop amplifier 316.

In summary, the gain control loop 310 is configured to control the gain control module 302 based on a difference in power between the first coupled input signal and the first coupled output signal. Although one structure of the gain control loop 310 is shown in FIG. 3, in other embodiments other arrangements may be used.

As shown in FIG. 3, the phase control module 303 is controlled by a separate phase control loop 320. As described above, the phase control loop 320 receives the second coupled input signal from the second input coupler 305, and receives the second coupled output signal from the second output coupler 307. The second coupled input signal and second coupled output signal are combined in a coupler 322. However, before being input to the coupler 322, the second coupled input signal is passed through a delay line 321. The delay line 321 is configured to delay the second coupled input signal to ensure the same electrical length across both signal paths for frequencies in the $RF_{IN}$ signal. That is, the delay line 321 is configured so that the electrical length of the "through path" including the gain and phase control modules 302, 303, the power amplifier 301, the second output coupler 307 and the coupler 322, is the same as the electrical length of the "coupled-through path" including the delay line 321 and the coupler 322.

In this way, the second coupled input signal and the second coupled output signal arriving at the coupler 322 at any point in time are controlled to correspond to the same part of the original $RF_{IN}$ signal. That is, the delay line 321 in the phase control loop 320 is arranged to delay the first signal before the error signal is obtained by the coupler 322, such that the delayed first signal and the second signal used to obtain the error signal correspond to the same part of the input signal $RF_{IN}$. Therefore the phase control loop 320 may be referred to as a feed-forward loop, since the second coupled input signal is "fed forward" and compared against the corresponding portion of the output $RF_{OUT}$ signal.

A signal path from the second input coupler 305 to the coupler 322 via the delay line 321 may be referred to as a "feed-forward path". As described above, the signal path through the phase control module 303, gain control module 302, and power amplifier 301 to the second output coupler 307 may be referred to as the "through path", and a signal path from the second output coupler 307 to the coupler 322 may be referred to as the "coupled-through path". The delay line 321 is therefore configured such that the electrical length of the feed-forward path is substantially the same as the combined electrical lengths of the through path and the coupled-through path. In the present embodiment, the delay line 321 is physically embodied as a length of coaxial cable having an appropriate physical length to achieve the required delay. However, other arrangements may be used in other embodiments.

In the present embodiment, the phase control loop 320 is configured such that when the amplified $RF_{OUT}$ signal output by the power amplifier 301 has the correct phase, the second coupled input signal and second coupled output signal arrive at the coupler 322 in-phase. The coupling factors of the second input coupler 305 and second output coupler 307 may be chosen such that when the power amplifier 301 is operating at the desired gain, the second coupled input signal and second coupled output signal have the same power level. Alternatively, an attenuator may be used to pull down the second coupled input signal or the second coupled output signal to the correct power level.

The coupler 322 is a 180° coupler, and therefore when the second coupled input signal and second coupled output signal are combined in the coupler 322, they will cancel at an output of the coupler 322 if amplified $RF_{out}$ signal outputted from the power amplifier 301 has the correct phase. In effect, the phase control loop 320 is arranged to subtract the second coupled input signal from the second coupled output signal to obtain a difference between the two signals, as an error signal. However, if the $RF_{OUT}$ signal does not have the correct phase, the second coupled output signal will not be in-phase with the second coupled input signal as they arrive at the coupler 322. In this case, the signals will not completely cancel, and the amplitude of the error signal output by the coupler 322 is representative of the phase difference between the signals. The phase control loop 320 can therefore detect whether the phase of the $RF_{OUT}$ signal is offset from the desired value, for example as a result of nonlinear phase distortions introduced by the power amplifier 301.

The error signal output by the coupler 322 is sent to a detector 323, which may be an RMS detector similar to the input detector 311 and output detector 312 of the gain control loop 310. The detector 323 measure the power level of the error signal, and outputs a signal representing the measured power to a processor 324. The processor is configured to adjust a phase adjustment applied to the $RF_{IN}$ signal by the phase control module 303, so as to minimise the error signal power level measured by the detector 323.

Although in the present embodiment, an error signal is obtained by taking the difference between the coupled input and output signals, in other embodiments the phase control loop 320 may be configured to add the coupled signals together to produce the error signal. For example, the second coupled input signal and second coupled output signal could be arranged to be in-phase when they arrive at the coupler 322, such that the signals add together instead of cancelling. In this case, the processor can be arranged to vary the phase applied to the $RF_{IN}$ signal so as to maximise the measured power of the error signal.

As described above, using separate control loops to control the gain and phase applied to the $RF_{IN}$ signal offers the advantage that the processing algorithm can be simplified in comparison to a conventional control system, since each control loop only deals with a single variable. Therefore a control system such as the one shown in FIG. 3 can operate with a shorter response time compared to a conventional control system. Furthermore, the gain and phase control can be accurately applied even when the gain control behaves as a phase shifter, which typically occurs when the power amplifier is operated at, or close to, saturation. In this case, varying the gain can affect the phase of the $RF_{OUT}$ signal, but the separate phase control loop can detect this change and automatically adjust the phase to compensate.

Although in the embodiment of FIG. 3, the gain control loop is implemented using analogue components, in other embodiments the gain control loop may be digitised. For example, a field programmable gate array (FPGA) or application specific integrated circuit (ASIC) may be configured to provide similar functionality to the analogue gain control loop of FIG. 3, in order to control the gain control module. Additionally, although in the present embodiment the gain and phase control loops are used to control an RF power amplifier, other embodiments may be used at different frequencies, i.e. not only at RF.

In the embodiment shown in FIG. 3, the phase control loop is a feedforward loop similar to a signal cancellation circuit of a feedforward linearization circuit. The phase control loop of FIG. 3 differs from a feedforward linearization circuit in that the error signal obtained by the coupler 322 is not subsequently combined with the $RF_{out}$ output signal of the power amplifier to cancel intermodulation products, as would normally happen in the error cancellation circuit of a feedforward linearization circuit. Instead, a power of the error signal is detected and used to determine a phase to be applied to the $RF_{in}$ input signal.

Figure 4:
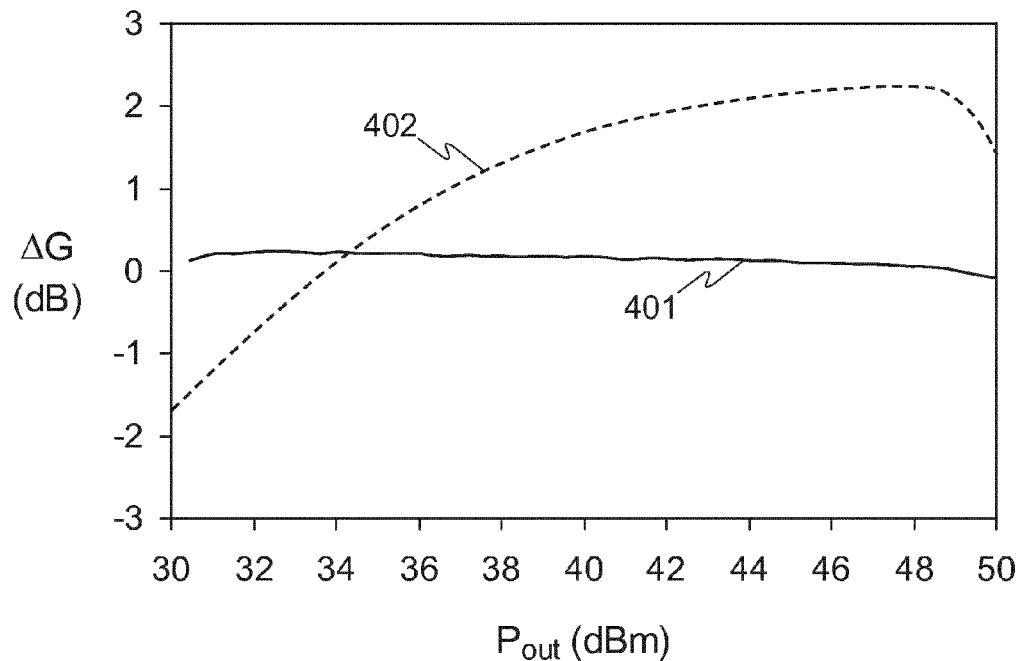
FIG. 4 is a graph comparing the gain control performance of a conventional open-loop control system with the control system of FIG. 3.

Referring now to FIG. 4, a graph comparing the gain control performance of a conventional open-loop control system with the control system of FIG. 3 is illustrated. The graph shows the variation in gain error (Delta Gain) over a range of output signal $RF_{OUT}$ power levels. The gain error is the difference between the actual gain and the target gain. A first curve 401, shown as a solid line in FIG. 4, illustrates the gain error for a range of output power levels when the control system of FIG. 3 is used to control a GaN power amplifier. A second curve 402, shown as a dashed line in FIG. 4, illustrates the gain error over the same power range when a conventional open-loop control system, such as the one shown in FIG. 1, is used to control the same GaN power amplifier. As shown in FIG. 4, the control system of FIG. 3 achieves substantially more stable gain control than is possible with the conventional open-loop control system.

Figure 5:
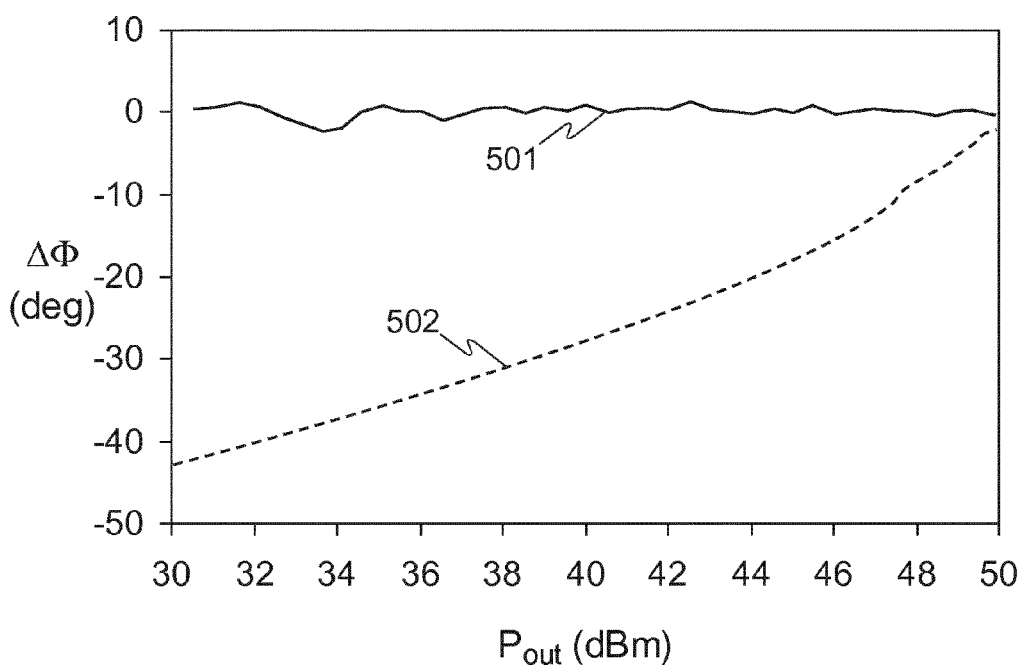
FIG. 5 is a graph comparing the phase control performance of a conventional open-loop control system with the control system of FIG. 3.

Referring now to FIG. 5, a graph comparing the phase control performance of a conventional open-loop control system with the control system of FIG. 3 is illustrated. The graph shows the variation in phase error (Delta Phase) over the same power range used in FIG. 4. A first curve 501, shown as a solid line in FIG. 5, illustrates the phase error when the control system of FIG. 3 is used to control the GaN power amplifier. A second curve 502, shown as a dashed line in FIG. 5, illustrates the phase error when a conventional open-loop control system is used to control the GaN power amplifier. As shown in FIG. 5, the control system of FIG. 3 achieves substantially more stable phase control than is possible with the conventional open-loop control system.

Preferably, the input and output detectors of the gain control loop should be RMS detectors. However, if the detectors are not good RMS detectors, a limiter can be used to clip the input signal $RF_{IN}$ before the signal reaches the first input coupler. In more detail, when the $RF_{IN}$ signal has a high peak-to-average ratio (PAR), the amplified signal $RF_{OUT}$ produced by the power amplifier can become clipped when the amplifier is driven to a high gain level. In this event the $RF_{OUT}$ signal will have a lower PAR than the $RF_{IN}$ signal, and accordingly the first coupled output signal will have a lower PAR than the first coupled input signal. If the input and output detectors are not good RMS detectors, the detectors may give a different measured power for signals having a different PAR, even when the RMS power of the signals is the same. Therefore when the $RF_{OUT}$ signal is clipped relative to the $RF_{IN}$ signal and the detectors are not good RMS detectors, different power levels may be measured by the input and output detectors even when the signals have the same RMS power level. This can result in the gain control being incorrectly applied.

To compensate for this, embodiments of the present invention in which the detectors are not good RMS detectors may further include a limiter coupled to an input of the first input coupler. The limiter is configured to clip the $RF_{IN}$ signal to the same extent as the $RF_{OUT}$ signal is clipped by the power amplifier. Accordingly, the first coupled input signal and first coupled output signal are clipped to the same extent, and the gain control error can be avoided.

Figure 6:
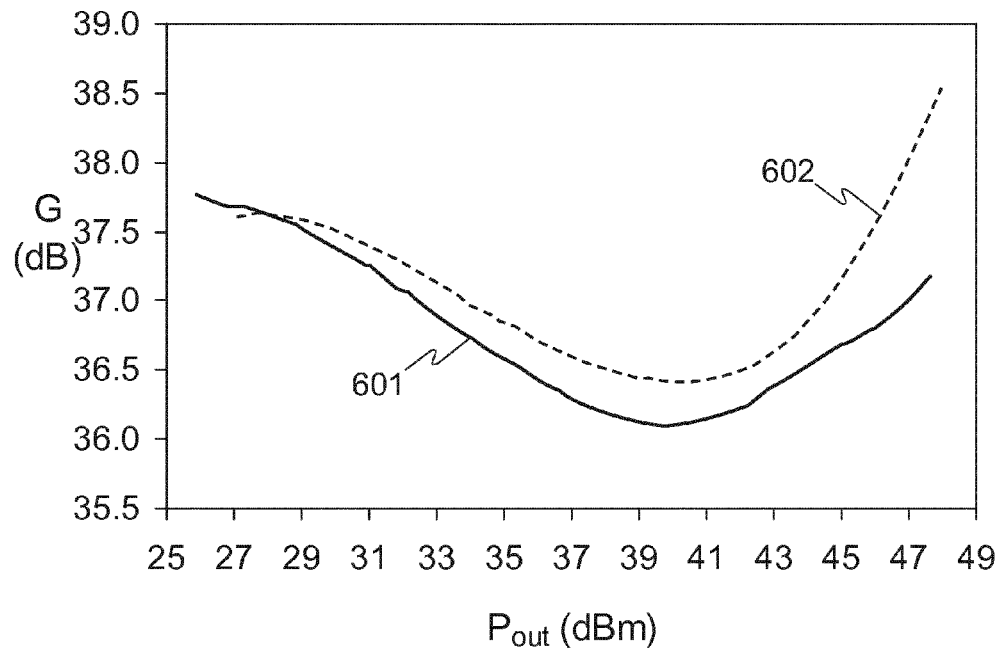
FIG. 6 is a graph illustrating an improvement in the gain error when a limiter is used to clip the $RF_{IN}$ signal to the same extent as the $RF_{OUT}$ signal is clipped by the power amplifier.

FIG. 6 is a graph illustrating the gain error over a range of output power levels, when the input and output detectors of the gain control loop are not good RMS detectors. A first curve 601, shown as a solid line in FIG. 6, illustrates the gain error when a limiter is used to clip the $RF_{IN}$ signal. For comparison purposes, a second curve 602 is also provided, shown as a dashed line in FIG. 6, to illustrate the gain error when the $RF_{IN}$ signal is not clipped. As shown in FIG. 6, without the limiter the gain error varies by as much as ±1.1 dB, but by using the limiter this can be improved to ±0.83 dB. By way of comparison, if good RMS detectors are used as in the embodiment of FIG. 3, the gain error varies by ±0.13 dB, as shown in FIG. 4.

A further embodiment of the present invention will now be described with reference to FIG. 7. The control system shown in FIG. 7 may be included in a satellite, such as a communications satellite, to control a power amplifier of the satellite. In this embodiment, gain and phase control is performed using a single feed-forward control loop 720. Like the embodiment of FIG. 3, the present embodiment comprises a power amplifier 701, gain control and phase control modules 702, 703 coupled to an input of the power amplifier 701, and input and output couplers 705, 707 configured to direct coupled input and coupled output signals, respectively, to the feed-forward control loop 720. Also like the embodiment of FIG. 3, the feed-forward control loop 720 includes a coupler 722 for combining the coupled input signal and coupled output signal, and a delay line 721 for delaying the coupled input signal before it is input to the detector 722. The coupler 722 outputs an error signal to a detector 723, which measures the power level of the error signal and sends a signal representing the measured power to a processor 724. As with the phase control loop 320 of FIG. 3, the control loop 720 of FIG. 7 is arranged to delay the first signal before obtaining the error signal, such that the delayed first signal and the second signal used to obtain the error signal correspond to the same part of the input signal $RF_{IN}$.

A detailed description of the operation of the feed-forward control loop 720 will be omitted to maintain brevity, since the error signal is obtained in a similar manner as in the embodiment of FIG. 3. However, in the present embodiment, the processor 724 determines, based on the measured power of the error signal, whether to adjust the gain and phase applied to the $RF_{IN}$ signal before it is input to the power amplifier 701. As such, the processor 724 is coupled to both the gain control module 702 and the phase control module 703 to control the gain and phase of the $RF_{IN}$ signal. Therefore, in the present embodiment, gain and phase control is performed using a single control loop.

Figure 7:
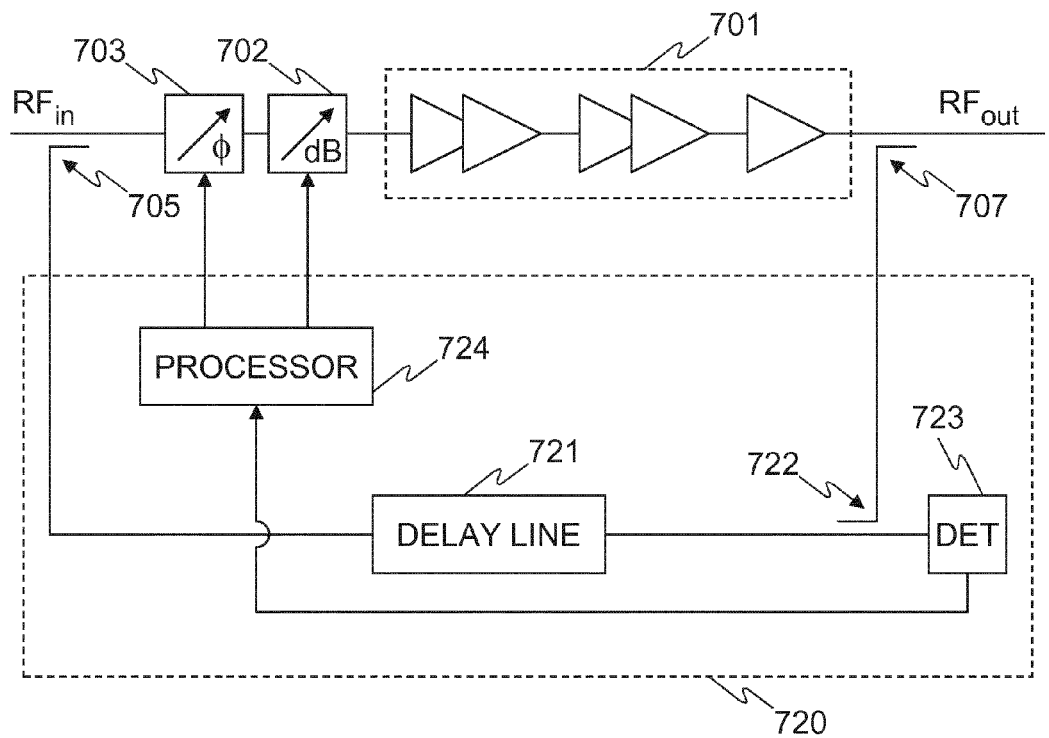
FIG. 7 illustrates a control system in which gain and phase control is performed using a single feed-forward control loop, according to an embodiment of the present invention.
Figure 8:
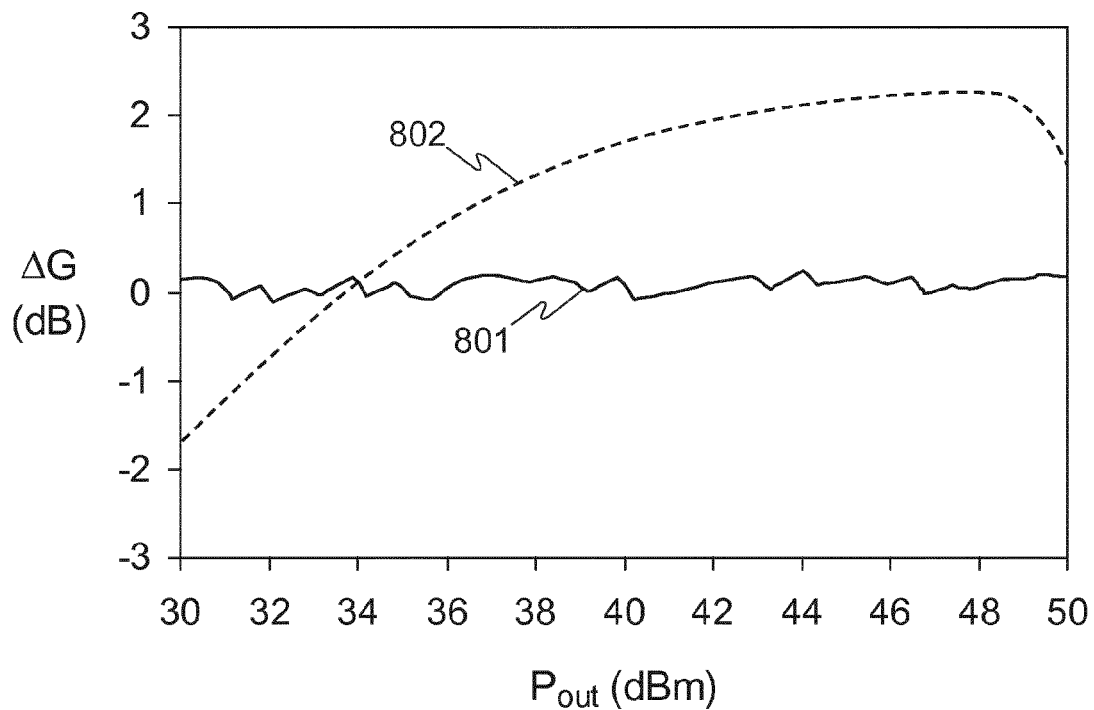
FIG. 8 is a graph comparing the gain control performance of the conventional open-loop control system with the control system of FIG. 7.

Referring now to FIG. 8, a graph comparing the gain control performance of the conventional open-loop control system with the control system of FIG. 7 is illustrated. The graph shows the variation in gain error over a range of $RF_{OUT}$ power levels. A first curve 801, shown as a solid line in FIG. 8, illustrates the gain error for a range of $RF_{OUT}$ power levels when the control system of FIG. 7 is used to control a GaN power amplifier. A second curve 802, shown as a dashed line in FIG. 8, illustrates the gain error over the same power range when a conventional open-loop control system, such as the one shown in FIG. 1, is used to control the same GaN power amplifier. As shown in FIG. 8, the control system of FIG. 7 achieves substantially more stable gain control than is possible with the conventional open-loop control system.

Figure 9:
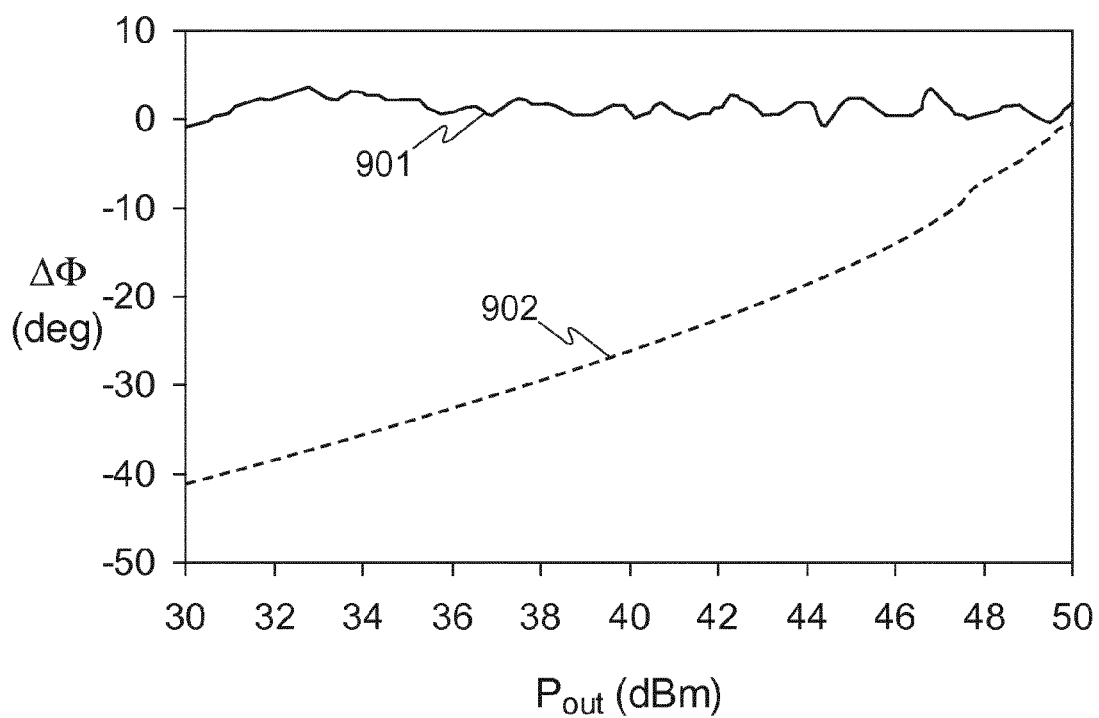
FIG. 9 is a graph comparing the phase control performance of the conventional open-loop control system with the control system of FIG. 7.

Referring now to FIG. 9, a graph comparing the phase control performance of the conventional open-loop control system with the control system of FIG. 7 is illustrated. The graph shows the variation in phase error over a range of $RF_{OUT}$ power levels. A first curve 901, shown as a solid line in FIG. 9, illustrates the phase error for a range of signal powers when the control system of FIG. 7 is used to control the GaN power amplifier. A second curve 902, shown as a dashed line in FIG. 9, illustrates the phase error over the same power range when the conventional open-loop control system is used to control the same GaN power amplifier. As shown in FIG. 9, the control system of FIG. 7 achieves substantially more stable phase control than is possible with the conventional open-loop control system.

In comparison with the embodiment of FIG. 3, the control system of FIG. 7 offers less stable gain control over a given range of output signal power, because a single control loop is used to control both the gain and phase. A more complex processing algorithm is required when a single loop controls both gain and phase, and accordingly the response time of the feed-forward control loop 720 of FIG. 7 is slower in comparison to the gain control and phase control loops 310, 320 of FIG. 3. Nonetheless, the embodiment of FIG. 7 still offers a substantial improvement over the conventional open-loop control system.

In more detail, when a conventional open-loop control system is used to control the gain and phase, the gain error can only be controlled to within a range of ±2 dB, as shown in FIGS. 4 and 8. When a single feed-forward control loop is used to control both gain and phase, as in the embodiment of FIG. 7, this is improved to ±0.23 dB, as shown in FIG. 8. When a separate closed loop is used to control the gain, as in the embodiment of FIG. 3, this is improved yet further to ±0.13 dB, as shown in FIG. 4.

Similarly, when the conventional open-loop control system is used to control both gain and phase, the phase error can only be controlled to within a range of ±20°, as shown in FIGS. 5 and 9. When a single feed-forward control loop is used to control both gain and phase, as in the embodiment of FIG. 7, this is improved to ±2.2°, as shown in FIG. 9. When a separate feed-forward control loop is used to control the phase, as in the embodiment of FIG. 3, this is improved yet further to ±1.8°, as shown in FIG. 5.

The results shown in FIGS. 4, 5, 8 and 9 were obtained during preliminary testing of embodiments constructed using relatively low-quality components. Nevertheless, as described above these early embodiments still offer a measurable improvement over the standard open-loop control system of FIG. 1, and a greater improvement will be expected following further optimisation.

Although embodiments of the present invention have been described in relation to controlling GaN power amplifiers that exhibit hysteresis-like memory effects, other embodiments may be used to control power amplifiers that do not exhibit such memory effects, for example GaAs-based devices. In these cases, a control system according to the present invention may still offer an advantage over the conventional open-loop control system of FIG. 1, by virtue of an improved response time that allows the gain and phase distortions to be more quickly adjusted in response to changes in the input signal power.

Additionally, embodiments of the present invention have been described in which the gain control loop monitors both the input and output signals. However, some embodiments may be configured for use in applications where the input signal has a known constant power, and in such embodiments the gain control loop can determine a current gain of the amplified signal without monitoring the input signal, since the power level of the input signal is already known.

Furthermore, embodiments of the present invention have been described in which the power levels of signals derived from the input and output signals are measured. This can allow the use of low-power detectors even when the input and/or amplified signals are high-power signals. Alternatively, in some embodiments the power levels of the input and/or amplified signals may be directly detected, in which case the first and/or second couplers and first and/or second detectors of FIG. 3 can be omitted accordingly.

Whilst certain embodiments of the present invention have been described above, the skilled person will understand that many variations and modifications are possible without departing from the scope of the invention as defined by the accompanying claims. In particular, any feature of any described embodiment may be used in conjunction with any feature of any other embodiment.

The invention claimed is:

1. Apparatus for controlling a gain and phase of an input signal input to a power amplifier, the apparatus comprising:
   gain control means for controlling the gain of the input signal;
   phase control means for controlling the phase of the input signal;
   a gain control loop configured to control the gain control means based on a power level of the input signal and a power level of an amplified signal output by the power amplifier, to obtain a predetermined gain of the amplified signal; and
   a phase control loop comprising:
      a coupler configured to combine a first signal derived from the input signal and a second signal derived from the amplified signal and output an error signal related to a phase difference between the first and second signals, the first and second signals being arranged to have the same power when the power amplifier is operating at the predetermined gain;
      a detector configured to measure a power level of the error signal; and
      a processor configured to control the phase control means based on the power level of the error signal to obtain a predetermined phase of the amplified signal,
   wherein the phase control loop is arranged to delay the first signal before obtaining the error signal, such that the delayed first signal and the second signal used to obtain the error signal correspond to the same part of the input signal.

2. The apparatus of claim 1, wherein the gain control loop is configured to receive a third signal derived from the input signal and a fourth signal derived from the amplified signal, and
   wherein the gain control loop is configured to compare a power level of the third signal and a power level of the fourth signal and control the gain control means based on the result of the comparison.

3. The apparatus of claim 2, further comprising:
an input coupler configured to receive the input signal and output the third signal, the input coupler having a first coupling factor; and
an output coupler configured to receive the amplified signal and output the fourth signal, the output coupler having a second coupling factor,
wherein the first and second coupling factors are selected such that when the amplified signal has the predetermined gain, the third signal and the fourth signal have substantially the same power level.

4. The apparatus of claim 2, wherein the gain control loop comprises:
a first detector configured to measure a power level of the third signal; and
a second detector configured to measure a power level of the fourth signal,
wherein the first and second detectors are matched root-mean-squared RMS detectors.

5. The apparatus of claim 2, wherein the gain control loop comprises:
a first detector configured to measure a power level of the third signal;
a second detector configured to measure a power level of the fourth signal; and
means for scaling an output of the first detector or an output of the second detector, so that the outputs of the first and second detectors are substantially identical when the third and fourth signals have the same power.

6. The apparatus of claim 5, wherein the amplified signal is clipped by the power amplifier, the apparatus further comprising:
a limiter configured to clip the input signal in correspondence with the clipping of the amplified signal by the power amplifier, such that the third signal received by the first detector and the fourth signal received by the second detector are clipped by substantially the same amount.

7. The apparatus of claim 1, wherein the phase control loop further comprises:
delaying means for delaying the first signal; and
error signal generating means for generating the error signal based on the second signal and the delayed first signal;
wherein the delaying means is configured such that the electrical length of a first path to the error signal generating means via the power amplifier is substantially the same as the electrical length of a second path to the error signal generating means via the delaying means.

8. The apparatus of claim 7, wherein the processing means is configured to control the phase control means in order to minimise the measured power of the error signal.

9. The apparatus of claim 1, wherein a current gain and phase of the amplified signal is dependent on an operational history of the power amplifier.

10. The apparatus of claim 1, wherein the apparatus is included in a satellite, and is configured to control the gain and phase of the input signal input to the power amplifier included in the satellite.

11. A method for controlling a gain and phase of an input signal input to a power amplifier, the method comprising:
controlling the gain of the input signal based on a power level of the input signal and a power level of an amplified signal output by the power amplifier, to obtain a predetermined gain of the amplified signal;
delaying a first signal derived from the input signal;
combining the delayed first signal and a second signal derived from the amplified signal, the first and second signals being arranged to have the same power when the power amplifier is operating at the predetermined gain;
outputting an error signal related to a phase difference between the first and second signals;
measuring a power level of the error signal; and
controlling the phase of the input signal according to the power level of the error signal to obtain a predetermined phase of the amplified signal,
wherein the first signal is delayed such that the delayed first signal and the second signal used to obtain the error signal correspond to the same part of the input signal.

12. The method of claim 11, further comprising:
comparing a power level of a third signal derived from the input signal and a power level of a fourth signal derived from the amplified signal, wherein the gain of the input signal is controlled based on the result of the comparison.

13. The method of claim 12, wherein the third and fourth signals are arranged to have the same power level when the amplified signal has the predetermined gain.

14. A satellite comprising:
a power amplifier for receiving an input signal and outputting an amplified signal;
gain control means for controlling a gain of the input signal;
phase control means for controlling a phase of the input signal; and
a control loop configured to combine a first signal derived from the input signal and a second signal derived from the amplified signal, output an error signal related to a phase difference between the first and second signals, the first and second signals being arranged to have the same power when the power amplifier is operating at the predetermined gain, measure a power level of the error signal, and control the gain control means and phase control means based on the power level of the error signal to obtain a predetermined gain and phase of the amplified signal,
wherein the control loop is arranged to delay the first signal before obtaining the error signal, such that the delayed first signal and the second signal used to obtain the error signal correspond to the same part of the input signal.

15. The satellite of claim 14, wherein the control loop further comprises:
a first coupler for outputting the first signal;
a second coupler for outputting the second signal;
delaying means for delaying the first signal; and
error signal generating means for receiving the delayed first signal and the second signal, and generating the error signal related to the phase difference between the delayed first signal and the second signal;
wherein the delaying means is configured such that the electrical length of a first path to the error signal generating means via the power amplifier is substantially the same as the electrical length of a second path to the error signal generating means via the delaying means.

* * * * *